(12) United States Patent
Römer et al.

(10) Patent No.: US 10,923,637 B2
(45) Date of Patent: Feb. 16, 2021

(54) METHOD OF MANUFACTURING A PLURALITY OF CONVERSION ELEMENTS, CONVERSION ELEMENT AND OPTOELECTRONIC COMPONENT

(71) Applicant: OSRAM Opto Semiconductors GmbH, Regensburg (DE)

(72) Inventors: Rebecca Römer, Regensburg (DE); Markus Leitl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/351,787

(22) Filed: Mar. 13, 2019

(65) Prior Publication Data

US 2019/0288164 A1    Sep. 19, 2019

(30) Foreign Application Priority Data

Mar. 14, 2018  (DE) .................... 10 2018 105 910.8

(51) Int. Cl.
   *H01L 33/50*    (2010.01)
(52) U.S. Cl.
   CPC .......... *H01L 33/508* (2013.01); *H01L 33/504* (2013.01); *H01L 33/505* (2013.01); *H01L 2933/0041* (2013.01)
(58) Field of Classification Search
   CPC ... H01L 33/508; H01L 33/505; H01L 33/504; H01L 2933/0041

(Continued)

(56) References Cited

U.S. PATENT DOCUMENTS

| 2015/0236223 | A1* | 8/2015 | Moosburger | ............ H01L 24/24 257/98 |
| 2017/0250318 | A1* | 8/2017 | Cha | ........................ H01L 33/505 |

(Continued)

FOREIGN PATENT DOCUMENTS

| JP | 2009-177106 A | 8/2009 |
| JP | 2015-076594 A | 4/2015 |

(Continued)

OTHER PUBLICATIONS

English translation of JP 2015076595.*

(Continued)

*Primary Examiner* — Dao H Nguyen
(74) *Attorney, Agent, or Firm* — DLA Piper LLP (US)

(57) ABSTRACT

A method of manufacturing a plurality of conversion elements includes providing a first conversion layer on an auxiliary carrier, the first conversion layer converting electromagnetic radiation of a first wavelength range into electromagnetic radiation of a second wavelength range, applying a second conversion layer on the first conversion layer, the second conversion layer converting electromagnetic radiation of the first wavelength range into electromagnetic radiation of a third wavelength range, and separating the generated layer stack such that a plurality of conversion elements are generated, wherein each conversion element includes at least one first converting region having material of the first conversion layer, each conversion element includes at least one second converting region having material of the second conversion layer, and the converting regions are arranged laterally side by side.

8 Claims, 8 Drawing Sheets

(58) Field of Classification Search
USPC ........ 257/98, 89, 88, 49, 291, 432, E27.133,
257/E27.135, E27.134, E33.055, E33.056,
257/E33.06, E33.061, E33.072; 313/501,
313/503; 438/27, 29, 72, 73
See application file for complete search history.

(56) References Cited

U.S. PATENT DOCUMENTS

| | | | |
|---|---|---|---|
| 2018/0004041 A1* | 1/2018 | Shin | G02F 1/133603 |
| 2018/0047796 A1* | 2/2018 | Kundaliya | H01L 27/3213 |

FOREIGN PATENT DOCUMENTS

| | | | |
|---|---|---|---|
| JP | 2015-076595 A | 4/2015 | |
| JP | 2015-228389 A | 12/2015 | |
| JP | 2016-219485 A | 12/2016 | |

OTHER PUBLICATIONS

Notice of Reasons for Refusal dated Jan. 14, 2020, of counterpart Japanese Application No. 2019-045840, along with an English translation.

\* cited by examiner

METHOD OF MANUFACTURING A PLURALITY OF CONVERSION ELEMENTS, CONVERSION ELEMENT AND OPTOELECTRONIC COMPONENT

TECHNICAL FIELD

This disclosure relates to a method of manufacturing a plurality of conversion elements, a conversion element and an optoelectronic component.

BACKGROUND

There is a need for a simplified method of manufacturing 1) a plurality of conversion elements, each having at least two different, separate regions with different wavelength converting properties, and 2) a conversion element with at least two different regions separated from each other that have different wavelength-converting properties, as well as an optoelectronic component with such a conversion element.

SUMMARY

We provide a method of manufacturing a plurality of conversion elements, including providing a first conversion layer on an auxiliary carrier, the first conversion layer converting electromagnetic radiation of a first wavelength range into electromagnetic radiation of a second wavelength range, applying a second conversion layer on the first conversion layer, the second conversion layer converting electromagnetic radiation of the first wavelength range into electromagnetic radiation of a third wavelength range, and separating the generated layer stack such that a plurality of conversion elements are generated, wherein each conversion element includes at least one first converting region having material of the first conversion layer, each conversion element includes at least one second converting region having material of the second conversion layer, and the converting regions are arranged laterally side by side.

We also provide a conversion element manufactured by a method of manufacturing a plurality of conversion elements, including providing a first conversion layer on an auxiliary carrier, the first conversion layer converting electromagnetic radiation of a first wavelength range into electromagnetic radiation of a second wavelength range, applying a second conversion layer on the first conversion layer, the second conversion layer converting electromagnetic radiation of the first wavelength range into electromagnetic radiation of a third wavelength range, and separating the generated layer stack such that a plurality of conversion elements are generated, wherein each conversion element includes at least one first converting region having material of the first conversion layer, each conversion element includes at least one second converting region having material of the second conversion layer, and the converting regions are arranged laterally side by side.

We further provide an optoelectronic component including a radiation-emitting semiconductor chip that emits electromagnetic radiation of a first wavelength range from a radiation exit surface, and the conversion element that converts electromagnetic radiation of the first wavelength range into electromagnetic radiation of the second wavelength range and the third wavelength range.

Figure 1:
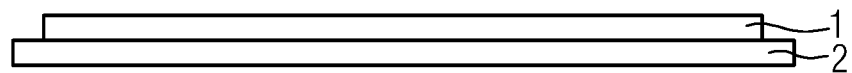
FIGS. 1 to 5 schematically show a method for the manufacture of a plurality of conversion elements according to an example.

REFERENCES 1 first conversion layer
2 auxiliary carrier
3 second conversion layer
4 layer stack
5 slice
6 separation line
7 conversion element
8 first converting region
9 second converting region
10 third conversion layer
11 semiconductor chip

DETAILED DESCRIPTION

Our method for the manufacture of a plurality of conversion elements provides a first conversion layer. The first conversion layer is suitable to convert electromagnetic radiation of a first wavelength range into electromagnetic radiation of a second wavelength range. Particularly preferably, the first conversion layer is provided on an auxiliary carrier.

A second conversion layer that converts electromagnetic radiation of the first wavelength range into electromagnetic radiation of a third wavelength range may be applied to the first conversion layer.

The generated layer stack may be separated such that a plurality of conversion elements is generated. The conversion elements can be formed in the same or in a different manner.

Particularly preferably, the layer stack is separated such that each conversion element has at least one first converting region having material of the first conversion layer or being formed of material of the first conversion layer. Further, each conversion element preferably also comprises at least one second converting region having material of the second conversion layer or being formed of material of the second conversion layer. Particularly preferably, the different converting regions are arranged laterally next to each other. Particularly preferably, the different converting regions are directly adjacent to each other. For example, at least two different converting regions of the conversion element are at least partially in direct contact with each other at an interface. In particular, each conversion element is preferably free of separation structures such as dams between the different converting regions.

The interface between two different converting regions can be arranged perpendicular to a main extension plane of the conversion element. Furthermore, it is also possible that the interface between two different converting regions includes an angle, for example, an acute angle with a normal of the main extension plane.

At least one further first conversion layer and at least one further second conversion layer may be alternatingly applied to the second conversion layer. In other words, the layer stack can comprise a plurality of first conversion layers and second conversion layers that are preferably arranged alternatingly.

A third conversion layer may be applied to the second conversion layer. The third conversion layer converts electromagnetic radiation of the first wavelength range into electromagnetic radiation of a fourth wavelength range. When separating a layer stack having at least three different conversion layers, each conversion element preferably has, in addition to the first converting region and the second converting region, at least one third converting region formed by or comprising material of the third conversion layer.

In this example, further conversion layers can also be incorporated in the layer stack, the further conversion layers preferably having different wavelength-converting properties from the first conversion layer, the second conversion layer and the third conversion layer. However, preferably all conversion layers convert electromagnetic radiation from the first wavelength range.

For example, the layer stack is formed from the conversion layers. For example, the layer stack consists of one or more first conversion layer(s), one or more second conversion layer(s), and one or more third conversion layer(s).

Furthermore, after separating the layer stack, each conversion element particularly preferably comprises a respective converting region comprising material of each conversion layer or formed from such a material. Preferably, the different converting regions are arranged laterally next to each other.

Particularly preferably, the first wavelength range, the second wavelength range, the third wavelength range and the fourth wavelength range are different from each other. For example, the first wavelength range comprises blue light or is formed from blue light. The second wavelength range comprises particularly preferably yellow to green light or is formed from yellow to green light. The third wavelength range comprises particularly preferably red light or is formed from red light. The fourth wavelength range, for example, has cyan light or is formed from cyan light.

If more than two different types of conversion layers are used in the layer stack, they may be repeated alternatingly in the layer stack.

Separation of the layer stack may comprise two separation steps. In the first separation step, the layer stack is preferably cut into a plurality of slices, for example, by sawing or with the help of a laser. The thickness of the slices is, for example, 10 micrometers to 200 micrometers. Preferably, the thickness of the slices is 30 micrometers to 100 micrometers.

Each of the slices preferably has a pattern formed by the conversion layers of the layer stack. For example, the pattern may be a spiral arrangement of the first conversion layer and the second conversion layer. It is also possible that the pattern is an alternating sequence of lines from the first conversion layer and the second conversion layer. Finally, the slice may also have a meandering arrangement of the first conversion layer and the second conversion layer.

Particularly preferably, each of the slices is cut into a plurality of conversion elements in a second separation step. Preferably, the second separation step takes place temporally separated from the first separation step. Preferably, the second separation step takes place after the first separation step.

Preferably, the slice is cut along two separation directions during the second separation step. Preferably, the two separating directions are perpendicular to each other. For example, separation along two separation directions can be performed in a single separation step. A suitable separation method for this is, for example, punching. The conversion elements manufactured in this way include particularly preferably the patterns described above at least partially. In other words, the converting regions are preferably arranged at least partially in one of the patterns at least partially within a conversion element. This improves mixing of the converted light.

In the second separation step, a plurality of shapes of the finished conversion elements can be advantageously manufactured. Conversion elements with recesses can thus be achieved. The recesses are preferably configured to spare a contact point of a semiconductor chip so that it can be electrically contacted with a bonding wire.

The first conversion layer and/or the second conversion layer, as well as any other conversion layers contained in the layer stack can be generated by one of the following methods, for example: spray coating, tape casting, spin coating.

Furthermore, it is also possible to use a prefabricated conversion layer. A prefabricated conversion layer can, for example, be connected to another conversion layer. A roller can be used for connecting.

The first conversion layer may comprise a polymeric matrix material into which a plurality of first phosphor particles have been introduced. The first phosphor particles convert electromagnetic radiation of the first wavelength range into electromagnetic radiation of the second wavelength range. In other words, the phosphor particles impart the wavelength-converting properties to the conversion layer, preferably.

Also, the second or any further conversion layer can comprise a polymeric matrix material into which a plurality of second or further phosphor particles are introduced. The second phosphor particles convert electromagnetic radiation of the first wavelength range into electromagnetic radiation of the third wavelength range. Each further conversion layer may contain a further plurality of phosphor particles that convert electromagnetic radiation of the first wavelength range into electromagnetic radiation of a further wavelength range.

Conversion layers in which phosphor particles are introduced into a polymeric matrix material can be generated, for example, by introducing the respective phosphor particles into the polymeric matrix material in liquid form and applying it by spray coating, tape casting or spin coating to an auxiliary carrier in liquid form so that a liquid conversion layer is formed. In the next step, the liquid conversion layer is preferably completely or partially cured.

For example, the polymeric matrix material in the liquid state comprises or consists of a plurality of non-crosslinked monomers. To cure the conversion layer, the monomers are usually cross-linked by polymerization. The polymerization can be initiated by temperature or UV radiation, for example. In this example, "partially cured" refers to the state of the polymeric matrix material in which not all monomers of the polymeric matrix material are crosslinked by the polymerization. Rather, a not negligible part of the monomers is not crosslinked with each other. However, the polymerization of the monomers is preferably so advanced that the liquid state of the matrix material has already changed to a hard state. "Fully cured" refers to the state in which the majority of the monomers of the matrix material are crosslinked by the polymerization process.

For example, a silicone can be used as a polymeric matrix material. All conversion layers of the layer stack may have the same matrix material.

For example, one of the following materials is suitable for the phosphor particles: Granatoids doped with rare earths, for example, compounds of the type $(Y,Lu,Gd)_3(Al,Ga)$ $_5O_{12}$, alkaline earth silicon nitrides doped with rare earths, for example, compounds of the type $(Mg,Ca,Sr,Ba)_2Si_5N_8$ or of the type $(Mg,Ca,Sr,Ba)SiN_2$, alumonitride silicates doped with rare earths, for example, compounds of the type $(Ca, Sr,Ba)AlSiN_3$ or of the type $(Sr,Ca)SrAl_2Si_2N_6$, oxy nitrides doped with rare earths, for example, $(Ca,Sr,Ba)Si_2O_2N_2$, aluminum oxy nitrides doped with rare earths, for example, compounds of the type α- or β-SiAlON, silicon nitrides doped with rare earths, for example, compounds of the type $(Sr,Ba)(Y,Yb)Si_4N_7$, compounds of the type $(Sr,Ca)[LiAl_3N_4]$ doped with rare earths, $K_2SiF_6:Mn^{4+}$, compounds of type $(K,Na)_2(Si,Ti)F_6$ doped with rare earths, orthosilicates doped with rare earths, for example, compounds of the type $(Mg,Ca,Sr,Ba)_2SiO_4$, oxides doped with rare earths, for example, compounds of type $(Mg,Ca, Sr,Ba)_4Al_{14}O_{25}$.

Furthermore, semiconductor nano-materials are also suitable for the phosphor particles. Such semiconductor nano-materials are, for example, CdS/CdSe core shell structures, preferably also other nanoparticulate semiconductor materials for wavelength conversion such as CdS, CdSe, CdTe, ZnS, ZnSe, ZnTe, HgTe, HgSe, GaP, GaAs, GaSb, AlP, AlAs, AlSb, InP, InAs, InSb, SiC, InN, AN or their mixed crystals (ternary, quaternary, . . . ) or a combination of several different semiconductor materials. Phosphor particles formed as nanoparticles can have a core shell and/or alloy structure.

It is possible that each conversion layer contains a mixture of different phosphor particles with different wavelength converting properties. Preferably, the different phosphor particles of a conversion layer convert electromagnetic radiation of the first wavelength range into different wavelength ranges originating from a similar spectral range. The finished conversion layers are particularly preferably free of phosphor particles of the other conversion layers.

For example, the phosphor particles have a mean diameter $d_{50}$ of 1 micrometer to 40 micrometers, preferably 5 micrometers to 30 micrometers, and particularly preferably 10 micrometers to 25 micrometers.

Phosphor particles comprising or formed from semiconductor nano-materials have, for example, an average diameter $d_{50}$ of 1 nanometer to 25 micrometers and preferably 10 nanometers to 10 micrometers.

Particularly preferably, the conversion layers have a thickness of 1 micrometer to 500 micrometers.

In addition to the conversion layers, the layer stack may also comprise other layers which, in addition to or as an alternative to the phosphor particles, contain a filler material or another material.

Particularly preferably, the layer stack is rolled or folded out of the main extension plane of the layer stack after application of the conversion layers and before separation. In such a way, the different patterns described above in the slices and thus in the finished conversion elements can be easily manufactured.

For example, the layer stack can be rolled into a cylinder. When separating the layer stack rolled into a cylinder, it is possible to produce round slices with a spiral pattern.

Furthermore, it is also possible that the layer stack is folded into a cuboid in a meandering or zigzag manner. When separating the cuboid folded in a meandering manner, rectangular slices with a meandering pattern can be created.

Preferably, the layer stack is fully cured after rolling or folding. This advantageously fixes the shape of the layer stack created by rolling or folding.

If the layer stack has a main extension plane, for example, in an unrolled or unfolded layer stack, the layer stack may be separated along separation planes into slices perpendicular to the main extension plane of the layer stack or at an acute angle to a normal of the main extension plane.

If the layer stack has a main extension direction, for example, in a rolled or folded layer stack, the layer stack may be separated along separating planes into slices perpendicular to the main extension direction of the layer stack or at an acute angle to a normal of the main extension direction.

The method described herein is particularly suitable for manufacturing a conversion element. Features, examples and developments which are described herein only in connection with the method may also be employed in the conversion element and vice versa.

Particularly preferably, the conversion element comprises at least two different converting regions having different converting properties. Particularly preferably, the two converting regions are completely separated from each other. For example, the first converting region does not include phosphor particles of the second converting region and vice versa. Particularly preferably, the different converting regions are laterally arranged next to each other and preferably arranged in a common plane. Particularly preferably, the different converting regions form a pattern. Particularly preferably, two converting regions of a conversion element are arranged directly adjacent to each other so that their materials are in direct contact with each other.

For example, the conversion element has a thickness of 10 micrometers to 200 micrometers and preferably 30 micrometers to 100 micrometers.

The conversion element described here is intended in particular for being used in an optoelectronic component. Features, examples and developments described herein only in connection with the conversion element may also be employed in the optoelectronic component and vice versa.

The optoelectronic component may comprise a radiation-emitting semiconductor chip. The radiation-emitting semiconductor chip emits electromagnetic radiation of a first wavelength range from a radiation exit surface. The radiation-emitting semiconductor chip preferably emits blue light.

The optoelectronic component may comprise a conversion element that converts electromagnetic radiation of the first wavelength range into electromagnetic radiation of the second wavelength range and the third wavelength range. For example, the conversion element is applied in direct contact to the radiation exit surface of the semiconductor chip.

Preferably, the conversion element converts blue radiation from the semiconductor chip into yellow to green radiation and red radiation. The optoelectronic component preferably emits mixed-colored radiation composed of unconverted radiation of the first wavelength range, converted radiation of the second wavelength range and converted radiation of the third wavelength range. The mixed-colored light is preferably composed of blue radiation of the semiconductor chip, yellow to green converted radiation of the second wavelength range and red converted radiation of the third wavelength range. Particularly preferably, the mixed-colored light has a color location in the warm-white range.

The color location of the mixed-colored light obtained with the help of the conversion element can be set to a desired value with advantage by selecting the thickness of the conversion layers, rolling and/or folding the layer stack and the resulting patterns of the conversion element as well as adapting the thickness of the finished conversion element.

The method described herein offers in particular the advantage of being able to simultaneously generate a plurality of conversion elements with separate laterally arranged converting regions using simple technologies. The converting regions can be arranged in patterns for better light mixing. The use of separation structures such as a dam or a mask to generate the different converting regions can advantageously be dispensed with in our methods. The conversion elements manufactured with our methods can contribute advantageously to an increase in the efficiency of an optoelectronic component and its brightness.

Further advantageous configurations and developments result from examples described in the following in connection with the figures.

Equal or similar elements as well as elements of equal function are designated with the same reference signs in the Figures. The Figures and the proportions of the elements shown in the Figures are not regarded as being shown to scale. Rather, single elements, in particular layers, can be shown exaggerated in magnitude for the sake of better presentation and/or better understanding.

In the method according to the example of FIGS. 1 to 5, a first conversion layer 1 is provided on an auxiliary carrier 2 (FIG. 1). For example, the first conversion layer 1 can be generated on the auxiliary carrier 2 by spray coating, tape casting or spin coating. The first conversion layer 1 is completely or partially cured. It is also possible to use a prefabricated first conversion layer 1. The first conversion layer 1 converts electromagnetic radiation from the blue spectral range into yellow-green light. The first conversion layer 1 comprises, for example, phosphor particles from a garnet phosphor material introduced into a polymeric matrix material.

Figure 2:
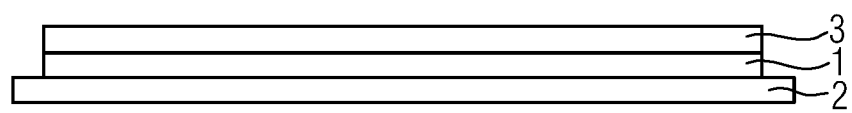

In a further method step, a second conversion layer 3 is applied to the first conversion layer 1, for example, also by spray coating, tape casting or spin coating (FIG. 2). The second conversion layer 3 is fully or partially cured. A prefabricated second conversion layer 3 can also be used for this method step. This can be laminated onto the first conversion layer 1. The second conversion layer 3 converts blue light into red light. The second conversion layer 3 comprises, for example, phosphor particles from a nitride phosphor introduced into a polymeric matrix material.

Figure 3:
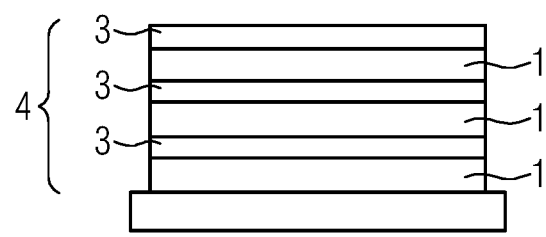

As shown schematically in FIG. 3, further first conversion layers 1 and second conversion layers 3 can be alternatingly applied to the second conversion layer 3. The result is a layer stack 4 with first conversion layers 1 and second conversion layers 3 applied alternatingly in direct contact with each other. The layer stack 4 can also be fully or partially cured after all conversion layers 1, 3 have been applied.

Figure 4:
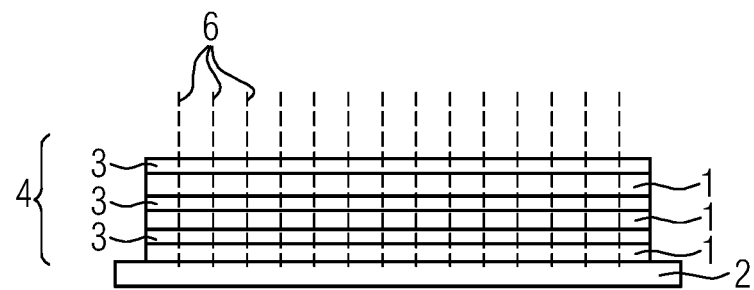

In a first separation step, the layer stack 4 is then divided into individual slices 5, for example, by sawing (FIG. 4). Each slice 5 has alternating thin layers of the material of the first conversion layer 1 and the second conversion layer 3.

Figure 5:
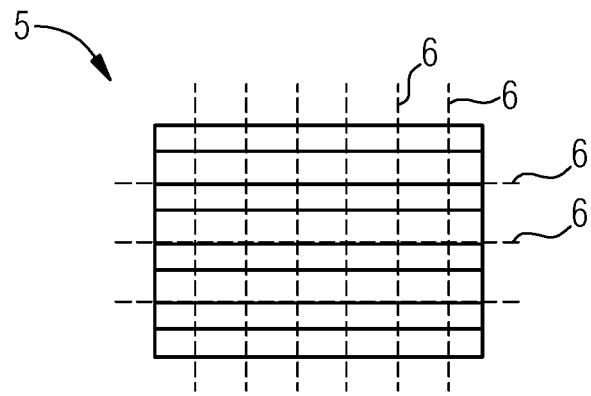

In a second separation step, each slice 5 is separated into a plurality of conversion elements 7 along vertical separation lines 6 (FIG. 5).

The conversion elements 7 according to the example of FIG. 6 can be manufactured, for example, with the method as described in connection with FIGS. 1 to 5.

Figure 6:
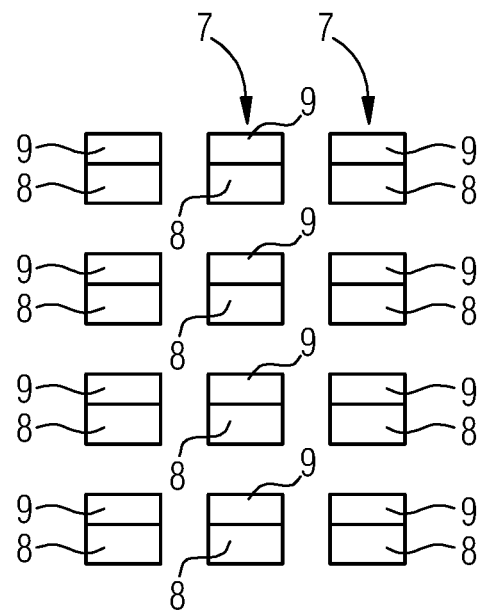
FIG. 6 shows a schematic top view of a plurality of conversion elements according to an example.

According to the example of FIG. 6, each conversion element 7 has a first converting region 8 and a second converting region 9. The first converting region 8 is formed from material of the first conversion layer 1. The second converting region 9 is formed from material of the second conversion layer 3. The first converting region 8 and the second converting region 9 are each arranged laterally side by side in direct contact.

Figure 7:
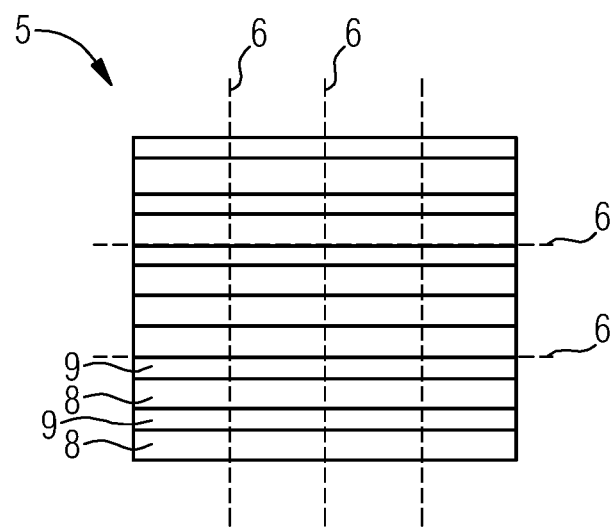
FIGS. 7 to 21 schematically show different examples of the method in more detail.
Figure 8:
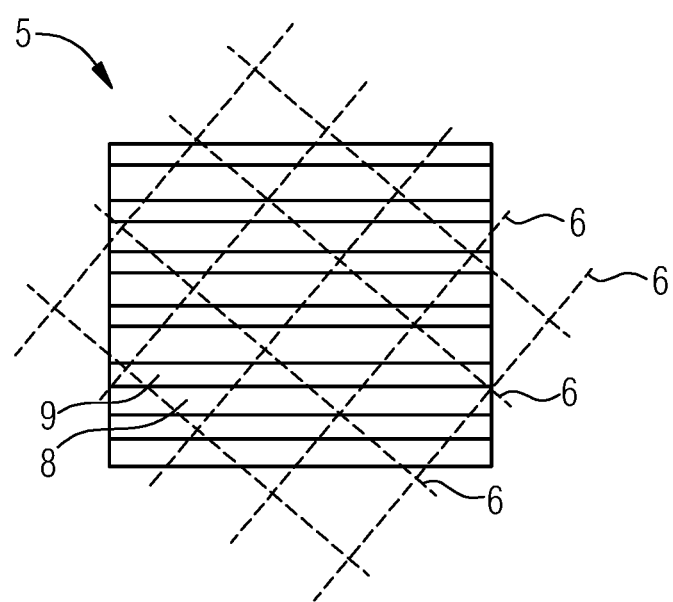

FIGS. 7 to 8 show alternative examples of separating lines 6 during the second separating step to separate a slice 5 that has been already described in connection with FIG. 5. The separating lines 6 are perpendicular to each other, wherein the separating lines 6 run parallel to a main extension plane of the conversion layers 1, 3 according to FIGS. 5 and 7 and perpendicular to the main extension plane of the conversion layers 1, 3. In contrast to the separation lines 6 of FIG. 5, the separation lines 6 in the example of FIG. 7 have larger distances to each other. In contrast to the separation lines 6 of FIG. 7, the separation lines 6 in the example of FIG. 8 are rotated by 90°.

Figure 9:
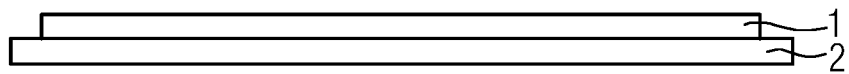
Figure 10:
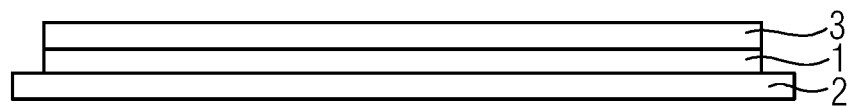

In the method according to the example of FIGS. 9 to 15, the method steps as described in connection with FIGS. 1 and 2 are carried out first (FIGS. 9 and 10).

Figure 11:
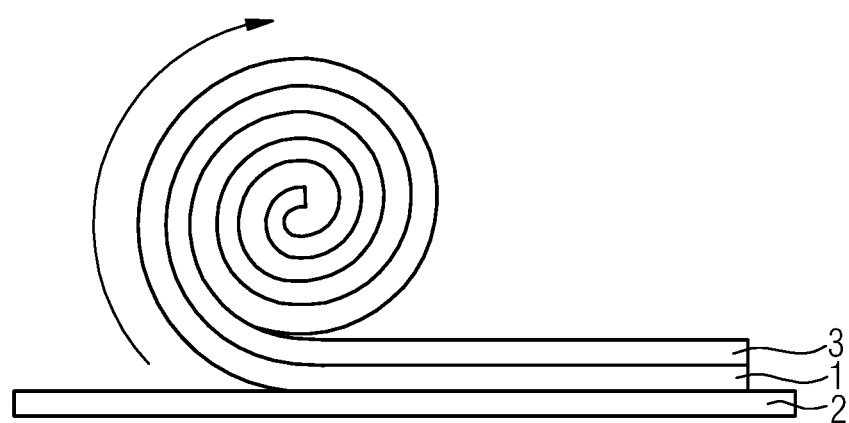
Figure 12:
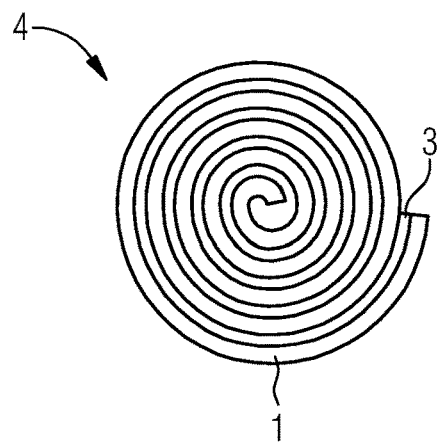
Figure 13:
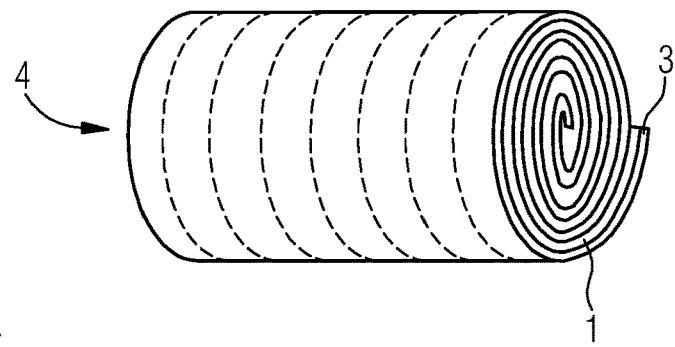

In a next step schematically shown in FIG. 11, the layer stack 4 formed from a first conversion layer 1 and a second conversion layer 3 is rolled up into a cylinder. After rolling, curing the layer stack 4 is particularly preferably performed to fix the shape of the cylinder (FIGS. 12 and 13).

Figure 14:
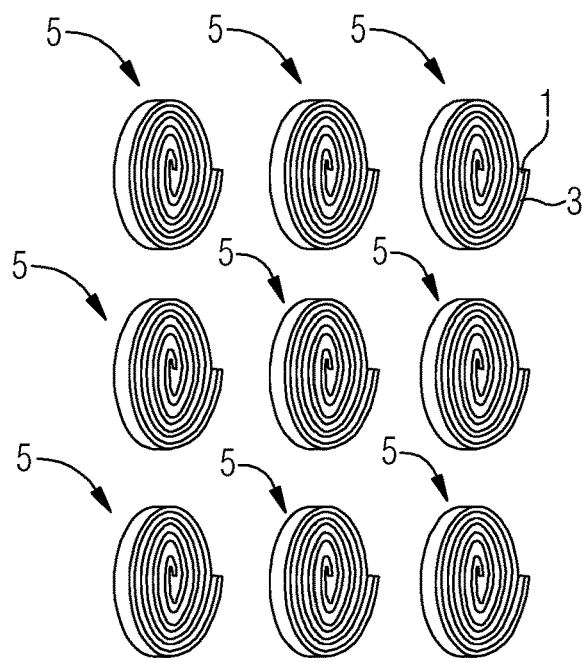

In a next step, the cylinder is separated by cutting into thin slices 5, which are shown schematically in FIG. 14.

Figure 15:
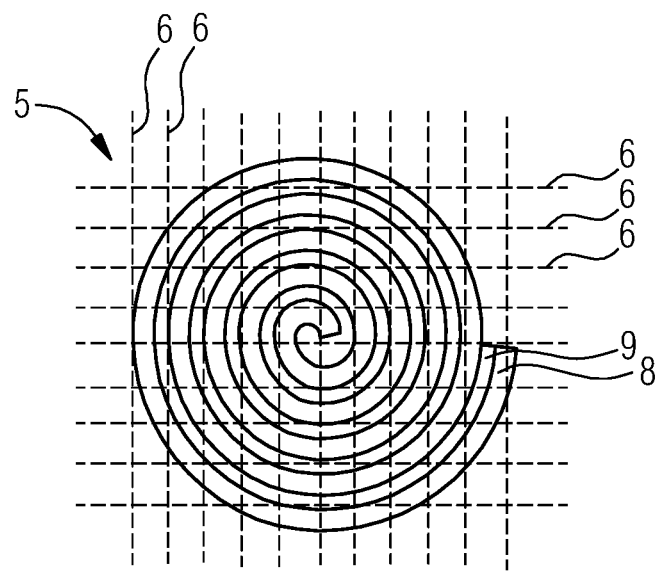
Figure 16:
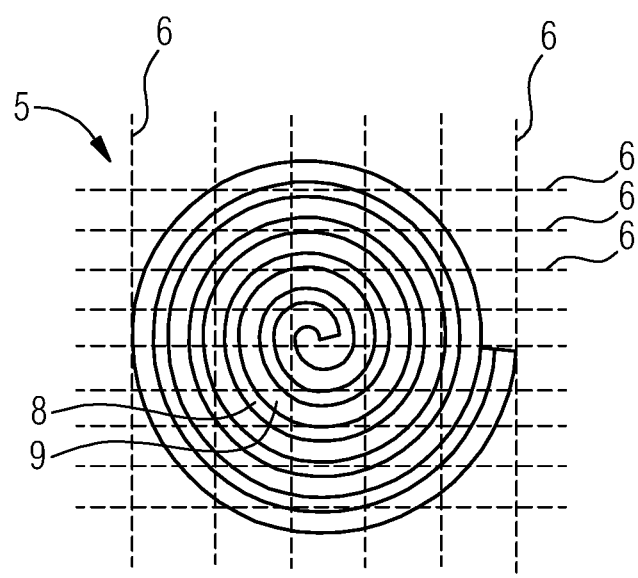

FIGS. 15 and 16 schematically show vertical separation lines 6, along which a slice 5 of a rolled layer stack 4 can be separated by punching into a plurality of conversion elements 7. It is possible to create different patterns within the conversion elements 7 by selecting the distances between the separation lines 6.

Figure 17:
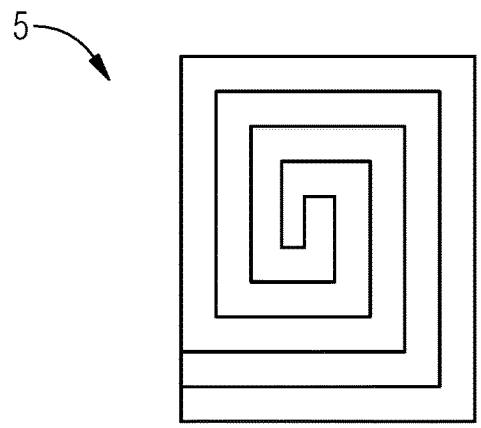

According to the example of FIG. 17, a layer stack 4 is formed from a first conversion layer 1 and a second conversion layer 3 by folding into a meandering cuboid separated by cutting into slices 5.

Figure 18:
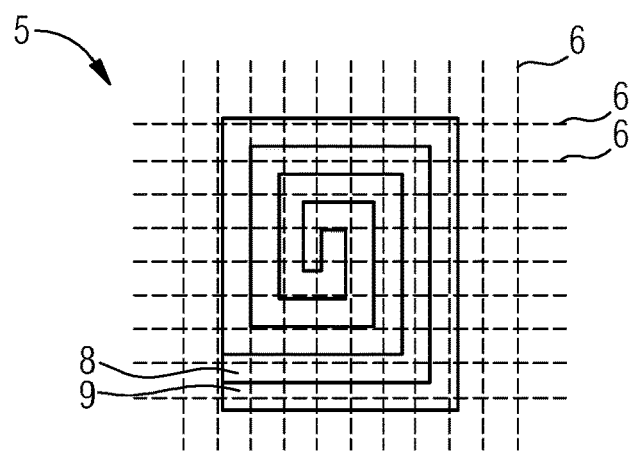
Figure 19:
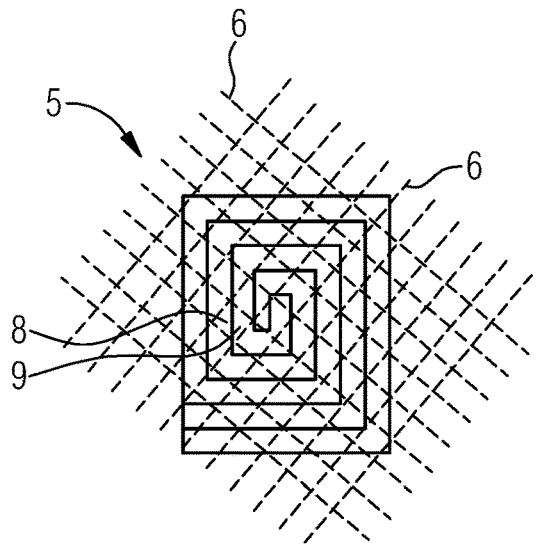

As shown in FIGS. 18 and 19, the slices 5 can be separated into a plurality of conversion elements 7 along separation lines 6 perpendicular to each other. The separation lines 6 according to the example of FIG. 19 are rotated by 90° compared to the separation lines 6 according to the example of FIG. 18.

Figure 20:
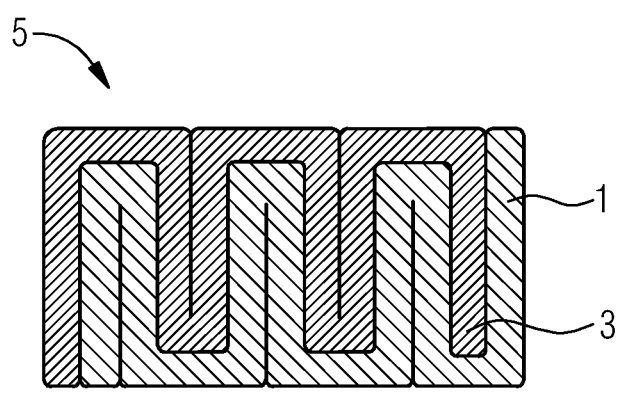

FIG. 20 schematically shows a cuboid as it can be generated by zigzag folding a layer stack 4 from a first conversion layer 1 and a second conversion layer 3 (see also FIG. 2).

Figure 21:
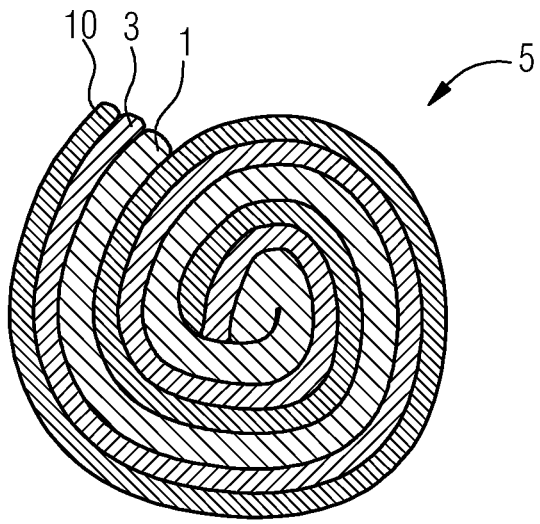

The layer stack 4 rolled into a cylinder according to the example of FIG. 21 has a third conversion layer 10 compared to the layer stack 4 rolled into a cylinder according to FIG. 12. The third conversion layer 10 is applied to the second conversion layer 3 and converts electromagnetic radiation of the first wavelength range into electromagnetic radiation of the fourth wavelength range.

Figure 22:
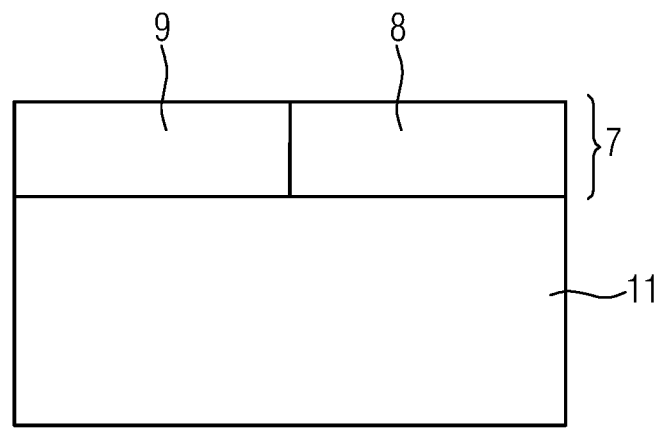
FIG. 22 shows a schematic cross-sectional view of an optoelectronic component according to an example.

The optoelectronic component according to the example of FIG. 22 has a radiation-emitting semiconductor chip 11 that emits blue light from a radiation exit surface. A conversion element 7, as already described, for example, in connection with FIG. 6 is applied to the radiation exit surface.

The conversion element 7 has a first converting region 8 that converts blue radiation of the semiconductor chip 11 into green radiation. A second converting region 9 that converts blue radiation of the semiconductor chip 11 into red radiation is arranged laterally next to the first converting region 8. The converting regions 8, 9 are directly adjacent to each other.

The optoelectronic component according to the example of FIG. 22 emits mixed-colored light that is composed of unconverted blue light, converted red light and converted green light and has a color location in the warm-white range.

This application claims priority of DE 102018105910.8, the subject matter of which is incorporated herein by reference.

Our methods, elements and components are not limited to the description of the examples. Rather, this disclosure comprises any new feature as well as any combination of features, particularly each combination of features of the appended claims, even if the feature or combination of features itself is not explicitly given in the claims or examples.

What is claimed is:

1. A method of manufacturing a plurality of conversion elements, comprising:

providing a first conversion layer on an auxiliary carrier, said first conversion layer converting electromagnetic radiation of a first wavelength range into electromagnetic radiation of a second wavelength range, applying a second conversion layer on said first conversion layer, said second conversion layer converting electromagnetic radiation of said first wavelength range into electromagnetic radiation of a third wavelength range, and separating the generated layer stack such that a plurality of conversion elements are generated, wherein each conversion element comprises at least one first converting region having material of the first conversion layer, each conversion element comprises at least one second converting region having material of the second conversion layer, the converting regions are arranged laterally side by side, separating the layer stack comprises two separation steps, wherein the layer stack is divided into a plurality of slices in the first separation step, and the slices are divided into the plurality of conversion elements in the second separation step, and the layer stack is folded into a cuboid in a zigzag manner.

2. The method according to claim 1, wherein at least one further first conversion layer and at least one further second conversion layer are applied alternatingly to the second conversion layer.

3. The method according to claim 1, further comprising:

applying a third conversion layer that converts electromagnetic radiation of the first wavelength range into electromagnetic radiation of a fourth wavelength range to the second conversion layer, wherein each conversion element comprises at least a third converting region comprising material of the third conversion layer.

4. The method according to claim 1, wherein the first conversion layer and/or the second conversion layer are/is generated by one of: spray coating, tape casting, and spin coating.

5. The method according to claim 1, wherein the first conversion layer comprises a polymeric matrix material in which a plurality of first phosphor particles is introduced, said first phosphor particles converting electromagnetic radiation of the first wavelength range into electromagnetic radiation of the second wavelength range, and/or the second conversion layer comprises a polymeric matrix material in which a plurality of second phosphor particles is introduced, said second phosphor particles converting electromagnetic radiation of the first wavelength range into electromagnetic radiation of the third wavelength range.

6. A conversion element manufactured by a method according to claim 1.

7. An optoelectronic component comprising:

a radiation-emitting semiconductor chip that emits electromagnetic radiation of a first wavelength range from a radiation exit surface, and the conversion element according to claim 6 that converts electromagnetic radiation of the first wavelength range into electromagnetic radiation of the second wavelength range and the third wavelength range.

8. The method according to claim 1, wherein the converting regions are arranged directly adjacent to each other.

* * * * *